(12) United States Patent
Jeon et al.

(10) Patent No.: US 11,217,299 B2
(45) Date of Patent: Jan. 4, 2022

(54) DEVICE AND METHOD FOR CALIBRATING REFERENCE VOLTAGE

(71) Applicant: Electronics and Telecommunications Research Institute, Daejeon (KR)

(72) Inventors: Young-deuk Jeon, Sejong-si (KR); Seong Min Kim, Sejong-si (KR); Jin Kyu Kim, Sejong-si (KR); Joo Hyun Lee, Daejeon (KR); Min-Hyung Cho, Daejeon (KR); Jin Ho Han, Seoul (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 16/997,445

(22) Filed: Aug. 19, 2020

(65) Prior Publication Data
US 2021/0151091 A1    May 20, 2021

(30) Foreign Application Priority Data

Nov. 15, 2019  (KR) .................. 10-2019-0146699
Aug. 12, 2020  (KR) .................. 10-2020-0100957

(51) Int. Cl.
*G11C 11/40*    (2006.01)
*G11C 11/4076*  (2006.01)
(Continued)

(52) U.S. Cl.
CPC ...... *G11C 11/4076* (2013.01); *G11C 11/4096* (2013.01); *G11C 11/4099* (2013.01)

(58) Field of Classification Search
CPC ............ G11C 11/4076; G11C 11/4096; G11C 11/4099
See application file for complete search history.

(56) References Cited

U.S. PATENT DOCUMENTS 6,753,701 B2 *  6/2004  Chang .................. G11C 7/1078
                                                326/29
8,456,924 B2 *  6/2013  Song .................... G11C 7/1006
                                                365/189.05

(Continued)

OTHER PUBLICATIONS

Junyoung Song et al., "A 1-V 10-Gb/s/pin Single-Ended Transceiver With Controllable Active-Inductor-Based Driver and Adaptively Calibrated Cascaded-Equalizer for Post-LPDDR4 Interfaces", IEEE Transactions on Circuits and Systems—I: Regular Papers, Jan. 2018, pp. 331-342, vol. 65, No. 1.

*Primary Examiner* — Vanthu T Nguyen
(74) *Attorney, Agent, or Firm* — Kile Park Reed & Houtteman PLLC

(57) ABSTRACT

Disclosed are a device and a method for calibrating a reference voltage. The reference voltage calibrating device includes a data signal communication unit that transmits/receives a data signal, a data strobe signal receiving unit that receives a first data strobe signal and a second data strobe signal, a voltage level of the second data strobe signal being opposite to a voltage level of the first data strobe signal, and a reference voltage generating unit that sets a reference voltage for determining a data value of the data signal, based on the first data strobe signal and the second data strobe signal, and the reference voltage generating unit adjusts the reference voltage based on the first data strobe signal and the second data strobe signal.

13 Claims, 10 Drawing Sheets

(51) Int. Cl.
*G11C 11/4096* (2006.01)
*G11C 11/4099* (2006.01)

(56) References Cited

U.S. PATENT DOCUMENTS

| | | | |
|---|---|---|---|
| 9,401,721 B1 * | 7/2016 | Barakat | G11C 7/1084 |
| 10,332,573 B2 * | 6/2019 | Hong | G11C 7/1084 |
| 10,878,869 B2 * | 12/2020 | Jeon | G11C 5/147 |
| 2003/0193358 A1 | 10/2003 | Nygren | |
| 2013/0148456 A1 | 6/2013 | Cho et al. | |
| 2014/0149654 A1 | 5/2014 | Venkatesan et al. | |
| 2017/0222648 A1 | 8/2017 | Lee et al. | |

* cited by examiner

DEVICE AND METHOD FOR CALIBRATING REFERENCE VOLTAGE

CROSS-REFERENCE TO RELATED APPLICATIONS

This application claims priority under 35 U.S.C. § 119 to Korean Patent Application Nos. 10-2019-0146699, and 10-2020-0100957, respectively filed on, Nov. 15, 2019, and Aug. 12, 2020 in the Korean Intellectual Property Office, the disclosures of which are incorporated by reference herein in their entireties.

BACKGROUND

Embodiments of the inventive concept described herein relate to a semiconductor device, and more particularly, relate to a device and a method for calibrating a reference voltage in a memory controller based on a background.

As a mobile device is supplied, various kinds of memories such as a double data rate (DDR) memory, a graphics double data rate (GDDR) memory, a low power double data rate (LPDDR) memory, and a high bandwidth memory (HBM) are being used in various electronic devices, depending on the purpose of use and a characteristic thereof. A memory is a kind of storage device capable of storing data and again reading data stored therein if necessary. Nowadays, a memory performing a high-speed operation is being actively developed to transmit a large amount of data within a short time. The memory that performs a high-speed operation needs to determine a data value within a shorter time with regard to transmitting data. However, because a reference voltage that is used as a reference for determining a data value varies depending on an external environment, the memory that performs the high-speed operation needs to calibrate the reference voltage more quickly depending on a change of the external environment for the purpose of processing data stably.

Most memory controllers are designed to calibrate a reference voltage when a memory chip operates for the first time and to again calibrate the reference voltage periodically or to again calibrate the reference voltage when that a temperature of the memory chip is changed as much as a given range or greater is sensed through an embedded temperature sensor. However, in a memory controller thus designed, a black-out time when the transmission of data is impossible while the reference voltage is calibrated may exist, thereby causing a decrease in the efficiency of transmission of data. Also, ideally, the reference voltage may be set to a middle value of a maximum voltage value and a minimum voltage value of a data signal. However, a value of a data signal that is actually transmitted may be randomly set to "1" or "0", and the data signal may be distorted due to a channel loss. For this reason, it is impossible to use an ideal reference voltage.

SUMMARY

Embodiments of the inventive concept provide a device and a method for calibrating a reference voltage for transmitting data stably without the occurrence of a black-out time.

A reference voltage calibrating device according to an embodiment of the inventive concept includes a data signal communication unit that transmits/receives a data signal, a data strobe signal receiving unit that receives a first data strobe signal and a second data strobe signal, a voltage level of the second data strobe signal being opposite to a voltage level of the first data strobe signal, and a reference voltage generating unit that sets a reference voltage for determining a data value of the data signal, based on the first data strobe signal and the second data strobe signal, and the reference voltage generating unit adjusts the reference voltage based on the first data strobe signal and the second data strobe signal.

For example, the data signal communication unit includes a data signal receiving unit that receives the data signal, and a data signal transmitting unit that transmits the data signal.

For example, the data signal receiving unit includes continuous time linear equalization that receives the data signal and the reference voltage and compensates for a partial frequency component of the data signal, an amplifier that receives and amplifies the data signal in which the partial frequency component is removed, and a comparator that determines a data value of the data signal.

For example, the data signal transmitting unit includes a driver circuit that transfers the data signal, and a first on-die termination circuit that adjusts a resistance of a data signal pin in outputting the data signal.

For example, the data strobe signal receiving unit includes a first on-die termination circuit that adjusts a resistance of a first data strobe signal pin receiving the first data strobe signal, a second on-die termination circuit that adjusts a resistance of a second data strobe signal pin receiving the second data strobe signal, continuous time linear equalization that receives the first data strobe signal and the second data strobe signal and compensates for a partial frequency component, and an amplifier that amplifies a signal output from the continuous time linear equalization.

For example, the reference voltage generating unit includes a first low pass filter that receives and filters the first data strobe signal to output a first data voltage, a second low pass filter that receives and filters the second data strobe signal to output a second data voltage, a first comparator that receives the first data voltage and the reference voltage and outputs a first signal based on the first data voltage and the reference voltage, a second comparator that receives the second data voltage and the reference voltage and outputs a second signal based on the second data voltage and the reference voltage, an up/down counter that performs a control operation for calibrating the reference voltage based on the first signal and the second signal, and a resistive digital-to-analog converter (RDAC) circuit that calibrates and outputs the reference voltage based on the control operation of the up/down counter.

For example, the RDAC circuit includes first to n-th resistors that are serially connected and are disposed in the form of an array, and first to (n−1)-th switches that are disposed on conducting wires diverging from connections between the first to n-th resistors.

For example, whether to turn on or off the first to (n−1)-th switches is determined by the control operation performed by the up/down counter.

For example, one of the first to (n−1)-th switches is turned on, and remaining switches thereof are turned off.

A reference voltage calibrating method according to an embodiment of the inventive concept includes receiving a first data strobe signal and a second data strobe signal being a differential signal of the first data strobe signal, outputting a first signal and a second signal based on the first data strobe signal and the second data strobe signal, calibrating a reference voltage based on the first signal and the second signal, receiving a data signal, and determining the data signal based on the reference voltage.

For example, the outputting of the first signal and the second signal is performed in response to receiving a preamble of the first data strobe signal and the second data strobe signal.

For example, the reference voltage calibrating method further includes comparing the first signal and the reference voltage to output a first output code, and comparing the second signal and the reference voltage to output a second output code.

For example, when the first output code and the second output code are identical at least once, an up/down counter controls control logic to calibrate the reference voltage. When the first output code and the second output code are different, the up/down counter maintains the reference voltage.

For example, the outputting of the first signal and the second signal is terminated in response to that a burst length is terminated.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
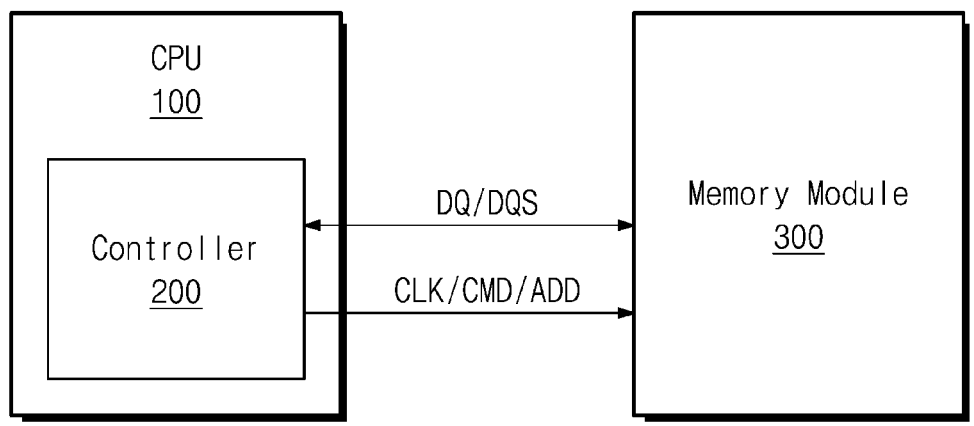
FIG. 1 is a block diagram illustrating a memory device according to an embodiment of the inventive concept.

Below, embodiments of the inventive concept may be described in detail and clearly to such an extent that an ordinary one in the art easily implements the inventive concept.

The terms used in the specification are provided to describe the embodiments, not to limit the inventive concept. As used in the specification, the singular terms "a," "an" and "the" are intended to include the plural forms as well, unless the context clearly indicates otherwise. The terms "comprises" and/or "comprising," when used in the specification, specify the presence of steps, operations, elements, and/or components, but do not preclude the presence or addition of one or more other steps, operations, elements, components, and/or groups thereof.

In the specification, the term "first and/or second" will be used to describe various elements but will be described only for the purpose of distinguishing one element from another element, not limiting an element of the corresponding term. For example, without departing the scope of the inventive concept, a first element may be referred to as a second element, and similarly, a second element may be referred to as a first element.

Unless otherwise defined, all terms (including technical and scientific terms) used in the specification should have the same meaning as commonly understood by those skilled in the art to which the inventive concept pertains. The terms, such as those defined in commonly used dictionaries, should not be interpreted in an idealized or overly formal sense unless expressly so defined herein. The same reference numerals represent the same elements throughout the specification.

FIG. 1 is a block diagram illustrating a memory device 10 according to an embodiment of the inventive concept. Referring to FIG. 1, the memory device 10 may include a central processing unit (CPU) 100 and a memory module 300. The CPU 100 may include a controller 200. The memory device 10 may be implemented with various dynamic random access (DRAM) devices such as a double data rate synchronous dynamic random access memory (DDR SDRAM), a DDR2 SDRAM, a DDR3 SDRAM, a DDR4 SDRAM, a DDR5 SDRAM, a low power double data rate (LPDDR) SDRAM, an LPDDR2 SDRAM, an LPDDR3 SDRAM, an LPDDR4 SDRAM, an LPDDR4X SDRAM, an LPDDR5 SDRAM, a graphics double data rate synchronous graphics random access memory (GDDR SGRAM), a GDDR2 SGRAM, a GDDR3 SGRAM, a GDDR4 SGRAM, a GDDR5 SGRAM, and a GDDR6 SGRAM. Alternatively, the memory device 100 may be implemented with a memory device, in which DRAM dies are stacked, such as a high bandwidth memory (HBM), an HBM2, or an HBM3. Alternatively, the memory device 10 may be implemented with a phase-change RAM (PRAM) device, a static RAM (SRAM) device, a resistive RAM (RRAM) device, a ferroelectric RAM (FRAM) device, a magnetic RAM (MRAM) device, etc.

The CPU 100 may decode and execute commands that are executable at the memory device 10. Also, the CPU 100 may perform an operation on data to be stored in the memory module 300 or data read from the memory module 300. The controller 200 included in the CPU 100 may control the memory module 300. The controller 200 may transmit a clock signal CLK, a command signal CMD, and an address signal ADD to the memory module 300. The command signal CMD may include a read command requesting the memory module 300 to read data and a write command requesting the memory module 300 to write data.

The memory module 300 may include a plurality of memory chips. The memory module 300 may be implemented based on a dual in-line memory module (DIMM) standard. For example, the memory module 300 may be implemented based on a registered DIMM (RDIMM) standard, a load reduced DIMM (LRDIMM) standard, an unbuffered DIMM (UDIMM) standard, a fully buffered DIMM (FB-DIMM) standard, or a small outline DIMM (SO-DIMM) (e.g., a single in-line memory module (SIMM)) standard. The memory module 300 may exchange a data signal DQ and a data strobe signal DQS with the controller 200.

In general, the controller 200 may use the data signal DQ for the purpose of calibrating a reference voltage. When a variety (e.g., tens) of patterns are received, the controller 200 may sweep a level of the reference voltage to various levels capable of being generated and may determine a level, at which an error does not occur with regard to the patterns, as a level of the reference voltage. However, because the above way to calibrate the reference voltage uses the data signal DQ while the reference voltage is calibrated, it is impossible to transmit data; because a level of the reference voltage is swept with respect to various patterns, a long time is taken to calibrate the reference voltage. Accordingly, to overcome the above issues, an embodiment according to the inventive concept is characterized in that an optimum reference voltage is drawn by using the data strobe signal DQS having a transmission line and an output circuit similar to a transmission line and an output circuit of the data signal DQ.

Considering input/output characteristics associated with a memory, sizes and structures of transistors included in buffers of driving outputs of the data signal DQ and the data strobe signal DQS may be identical (or similar). Accordingly, to reduce an error rate of data, characteristics such as lengths and line widths of signal transmission lines respectively connected with a pin for transferring the data signal DQ and a pin for transferring the data strobe signal DQS may be identical. For this reason, losses occurring at the transmission lines may be identical (or similar), and electrical characteristics of the data signal DQ and the data strobe signal DQS may also be almost identical.

Meanwhile, the data signal DQ may be transmitted by using a combination of a first logical level (e.g., 1) and a second logical level (e.g., 0). However, because a ratio of the first logical level and the second logical level varies depending on a characteristic of data to be transmitted, it is difficult to draw a reference voltage for determining a logical level by using the data signal DQ. In contrast, because the case of the data strobe signal DQS is based on a clock signal toggling between the first logical level and the second logical level periodically, it is easy to draw a reference voltage for determining a logical level by using the data strobe signal DQS. Accordingly, embodiments of the inventive concept may draw an appropriate reference voltage more easily by calibrating a reference voltage by using the data strobe signal DQS, not the data signal DQ. Below, components included in the controller 200 being the subject of reference voltage calibration and a reference voltage calibrating method will be more fully described with reference to FIGS. 2 to 10.

Figure 2:
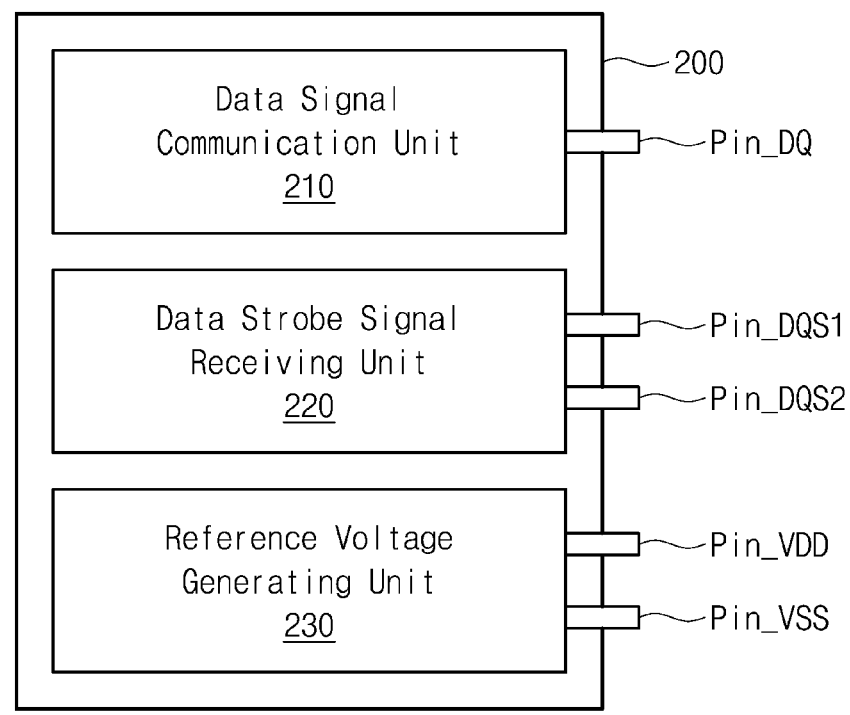
FIG. 2 is a block diagram illustrating a configuration of a controller according to an embodiment of the inventive concept.

FIG. 2 is a block diagram illustrating a configuration of the controller 200 according to an embodiment of the inventive concept. Referring to FIG. 2, the controller 200 may include a data signal communication unit 210, a data strobe signal receiving unit 220, and a reference voltage generating unit 230. The controller 200 may include a plurality of pins Pin_DQ, Pin_DQS1, and Pin_DQS2 for exchanging a data signal and a data strobe signal with the outside and a plurality of pins Pin_VDD and Pin_VSS for transferring voltages. However, the controller 200 according to an embodiment of the inventive concept may further include any other components and any other pins for communication with the outside, and the configuration of the controller 200 is not limited to the example illustrated in FIG. 2.

The data signal communication unit 210 may exchange the data signal DQ (refer to FIG. 1) with the memory module 300 (refer to FIG. 1) through the data signal pin Pin_DQ. In detail, the data signal communication unit 210 may receive the data signal DQ from the memory module 300 when the memory device 10 (refer to FIG. 1) performs the read operation and may transmit the data signal DQ including data information to be stored in the memory module 300 to the memory module 300 when the memory device 10 performs the write operation. Components included in the data signal communication unit 210 and a signal processing method of the data signal communication unit 210 will be more fully described with reference to FIG. 3. Meanwhile, although not illustrated in FIG. 2, the memory module 300 may also include components identical or similar to the data signal communication unit 210, the data strobe signal receiving unit 220 and the reference voltage generating unit 230.

The data strobe signal receiving unit 220 may exchange the data strobe signal DQS (refer to FIG. 1) with the memory module 300 (refer to FIG. 1) through a first data strobe signal pin Pin_DQS1 and a second data strobe signal pin Pin_DQS2. In detail, when the memory device 10 performs the read operation, the data strobe signal receiving unit 220 may receive the data strobe signal DQS from the memory module 300. In an embodiment of the inventive concept, the data signal DQ may be synchronized with the data strobe signal DQS. Meanwhile, although not illustrated in FIG. 2, the memory module 300 may also include a component identical or similar to the data strobe signal receiving unit 220. The corresponding component included in the memory module 300 may receive the data strobe signal DQS from the controller 200 when the memory device 10 performs the write operation.

The data strobe signal receiving unit 220 may receive the data strobe signal DQS from the memory module 300 and may recover the data strobe signal DQS. To minimize a noise, a data strobe signal (e.g., DQS1) received through the first data strobe signal pin Pin_DQS1 and a data strobe signal (e.g., DQS2) received through the second data strobe signal pin Pin_DQS2 may be signals of complementary levels (e.g., signals being 180 degrees out of phase). That is, the first data strobe signal DQS1 applied through the first data strobe signal pin Pin_DQS1 and the second data strobe signal DQS2 applied through the second data strobe signal pin Pin_DQS2 may be differential signals (or differential-mode signals). Components included in the data strobe signal receiving unit 220 and a signal processing method of the data strobe signal receiving unit 220 will be more fully described with reference to FIG. 4.

The reference voltage generating unit 230 may calibrate a reference voltage for determining a data value based on data strobe signals (e.g., DQS1 and DQS2). The reference voltage generating unit 230 may be supplied with a power supply voltage for the memory device 10 from a power supply voltage pin Pin_VDD and may be supplied with a ground voltage from a ground voltage pin Pin_VSS. The reference voltage generating unit 230 may calibrate a reference voltage by using data strobe signals (e.g., DQS1 and DQS2) processed by the data strobe signal receiving unit 220. Components included in the reference voltage generating unit 230 and a signal processing method of the reference voltage generating unit 230 will be more fully described with reference to FIG. 5. Also, a reference voltage calibrating method of the reference voltage generating unit 230 will be more fully described with reference to FIG. 10.

Figure 3:
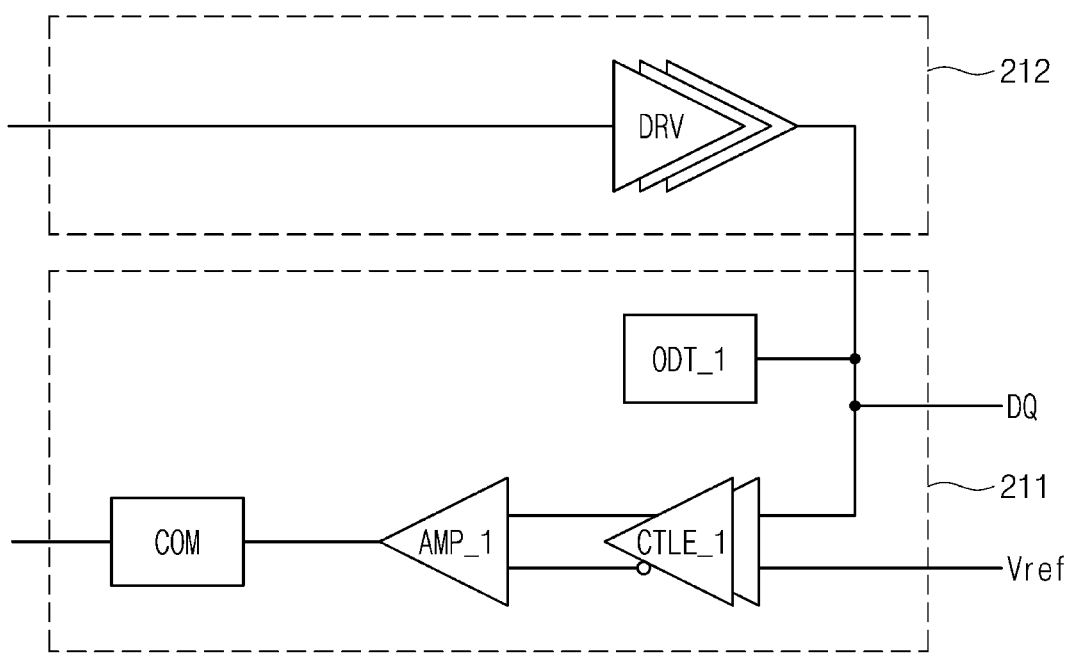
FIG. 3 is a schematic circuit diagram of a data signal communication unit according to an embodiment of the inventive concept.

FIG. 3 is a schematic circuit diagram of the data signal communication unit 210 according to an embodiment of the inventive concept. FIG. 3 shows only essential components of the data signal communication unit 210 according to an embodiment of the inventive concept. However, the data signal communication unit 210 may further include any other components, and the configuration of the data signal communication unit 210 is not limited to the example illustrated in FIG. 3. Referring to FIG. 3, the data signal communication unit 210 may include a data signal receiving unit 211 and a data signal transmitting unit 212. In detail, the data signal receiving unit 211 may include an on-die termination (ODT) circuit ODT_1, continuous time linear equalization (CTLE) CTLE_1, an amplifier AMP_1, and a comparator COM. The data signal transmitting unit 212 may include a driver circuit DRV.

To read data stored in the memory module 300 (refer to FIG. 1) from the memory module 300, the data signal receiving unit 211 may receive the data signal DQ. The ODT circuit ODT_1 may adjust a termination resistance value of the data signal pin Pin_DQ through which the data signal DQ is received. The ODT circuit ODT_1 may operate independently under control of the controller 200, and the signal integrity of the data signal DQ transmitted from the memory module 300 may be improved at the data signal receiving unit 211 by the ODT circuit ODT_1.

The data signal DQ input to the data signal communication unit 210 and a reference voltage Vref for determining a data value that the data signal DQ indicates may be transferred to the CTLE CTLE_1 included in the data signal receiving unit 211. The CTLE CTLE_1 may compensate for a partial frequency component of a received signal. In general, as a frequent increases, a high-frequency component has a great influence of a channel compared to a low-frequency component. This may mean that an attenuation rate of a signal increases. Accordingly, the CTLE CTLE_1 may amplify a magnitude of a high-frequency component such that all frequency components of an input signal are set to similar magnitudes, thus making a jitter or an eye diagram better.

The CTLE CTLE_1 may compensate for a partial frequency component of the received data signal DQ before transferred to the amplifier AMP_1, and the amplifier AMP_1 may amplify the received data signal DQ. The data signal DQ amplified from the amplifier AMP_1 may be transferred to the comparator COM. The comparator COM may finally determine a data value of the data signal DQ. In detail, when determining a data value, the comparator COM may determine the data signal DQ, a level of which is greater in magnitude than a level of a specific voltage, as "1" and may determine the data signal DQ, a level of which is smaller in magnitude than the level of the specific voltage, as "0".

Meanwhile, to write data in the memory module 300, the data signal transmitting unit 212 may transmit the data signal DQ. Under control of the CPU 100 (refer to FIG. 1), the data signal DQ that includes data information to be programmed in the memory module 300 may be transmitted from the controller 200 included in the CPU 100 to the memory module 300. The data signal DQ to be transmitted to the memory module 300 may be provided to the memory module 300 through the driver circuit DRV included in the data signal transmitting unit 212.

Figure 4:
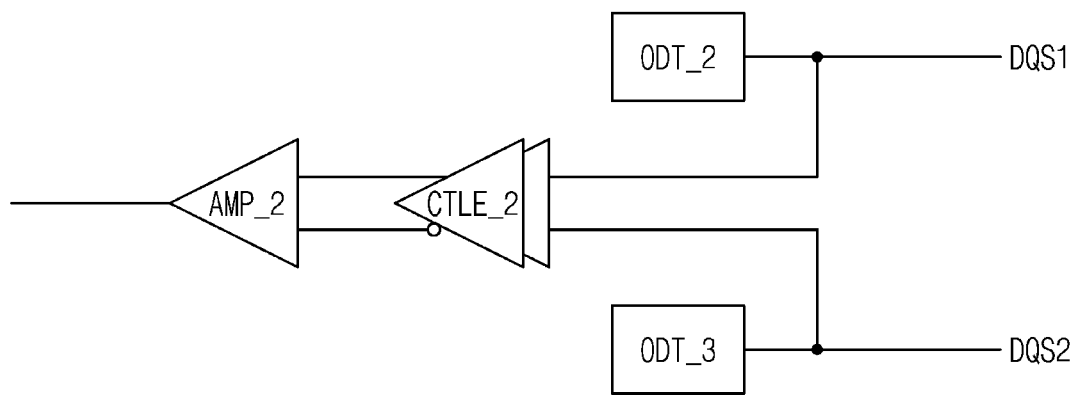
FIG. 4 is a schematic circuit diagram of a data strobe signal receiving unit according to an embodiment of the inventive concept.

FIG. 4 is a schematic circuit diagram of the data strobe signal receiving unit 220 according to an embodiment of the inventive concept. FIG. 4 shows only essential components of the data strobe signal receiving unit 220 according to an embodiment of the inventive concept. However, the data strobe signal receiving unit 220 may further include any other components, and the configuration of the data strobe signal receiving unit 220 is not limited to the example illustrated in FIG. 4. The data strobe signal receiving unit 220 may include a first ODT circuit ODT_2, a second ODT circuit ODT_3, a CTLE CTLE_2, and an amplifier AMP_2. The data strobe signal receiving unit 220 disclosed in FIG. 4 may receive the first data strobe signal DQS1 from the first data strobe signal pin Pin_DQS1 and the second data strobe signal DQS2 from the second data strobe signal pin Pin_DQS2. With regard to functions and characteristics of components, which are identical to the above components, from among components included in the data strobe signal receiving unit 220, additional description will be omitted to avoid redundancy.

The first data strobe signal DQS1 and the second data strobe signal DQS2 may be signals of complementary levels, that is, differential signals (or differential-mode signals). The first data strobe signal DQS1 and the second data strobe signal DQS2 received by the data strobe signal receiving unit 220 may be provided to the CTLE CTLE_2 for the purpose of compensating for a partial frequency component thereof. The first ODT circuit ODT_2 may adjust a termination resistance value of the first data strobe signal pin Pin_DQS1 in receiving the first data strobe signal DQS1, and the second ODT circuit ODT_3 may adjust a termination resistance value of the second data strobe signal pin Pin_DQS2 in receiving the second data strobe signal DQS2. The first and second data strobe signals DQS1 and DQS2 in which a frequency component is compensated for may be provided from the CTLE CTLE_2 to the amplifier AMP_2 so as to be amplified by the amplifier AMP_2.

Figure 5:
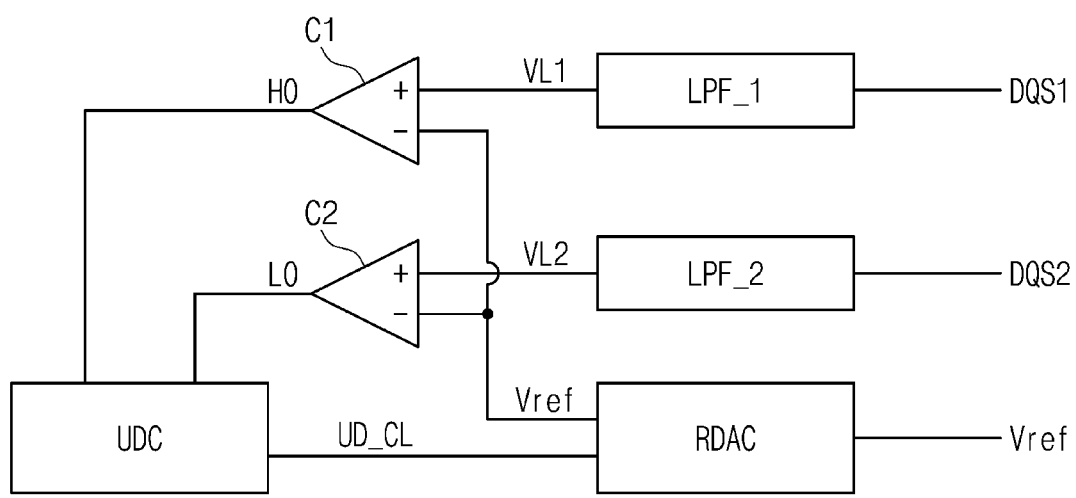
FIG. 5 is a schematic circuit diagram of a reference voltage generating unit according to an embodiment of the inventive concept.

FIG. 5 is a schematic circuit diagram of the reference voltage generating unit 230 according to an embodiment of the inventive concept. FIG. 5 shows only essential components of the reference voltage generating unit 230 according to an embodiment of the inventive concept. However, the reference voltage generating unit 230 may further include any other components, and the configuration of the reference voltage generating unit 230 is not limited to the example illustrated in FIG. 5. Referring to FIG. 5, the reference voltage generating unit 230 may include a first low pass filter LPF_1, a second low pass filter LPF_2, a first comparator C1, a second comparator C2, an up/down counter UDC, and a resistive digital-to-analog converter (RDAC) circuit RDAC.

The first data strobe signal DQS1 and the second data strobe signal DQS2 received by the data strobe signal receiving unit 220 (refer to FIG. 2) may be input to the reference voltage generating unit 230. Each of the first and second low pass filters LPF_1 and LPF_2 may pass only a low frequency component of an input signal. In other words, each of the first and second low pass filters LPF_1 and LPF_2 may pass only a signal having a frequency component lower than a cut-off frequency determined in advance. The first data strobe signal DQS1 input to the reference voltage generating unit 230 may be transferred to the first low pass filter LPF_1. The first data strobe signal DQS1 filtered by the first low pass filter LPF_1 may be output as a first data voltage signal VL1. Meanwhile, the second data strobe signal DQS2 input to the reference voltage generating unit 230 may be transferred to the second low pass filter LPF_2. The second data strobe signal DQS2 filtered by the second low pass filter LPF_2 may be output as a second data voltage signal VL2.

The first comparator C1 may receive the first data voltage signal VL1 through a (+) terminal and the reference voltage Vref through a (−) terminal. The first comparator C1 may compare the first data voltage signal VL1 and the reference voltage Vref to draw a first output code HO. The second comparator C2 may receive the second data voltage signal VL2 through a (+) terminal and the reference voltage Vref through a (−) terminal. The second comparator C2 may compare the second data voltage signal VL2 and the reference voltage Vref to draw a second output code LO. The first and second output codes HO and LO may be input to the up/down counter UDC.

The up/down counter UDC may determine whether the reference voltage Vref appropriate for determining a data value is generated in the memory device 10, based on the first and second output codes HO and LO thus input. Also, the up/down counter UDC may control the RDAC circuit RDAC based on a result of determining whether the appropriate reference voltage Vref is generated. The up/down counter UDC may provide the RDAC circuit RDAC with an up/down control signal UD_CL for controlling the RDAC circuit RDAC. The RDAC circuit RDAC may calibrate the reference voltage Vref based on the up/down control signal UD_CL provided from the up/down counter UDC. How the up/down counter UDC and the RDAC circuit RDAC are driven will be more fully described with reference to FIGS. 7 to 9C.

Figure 6A:
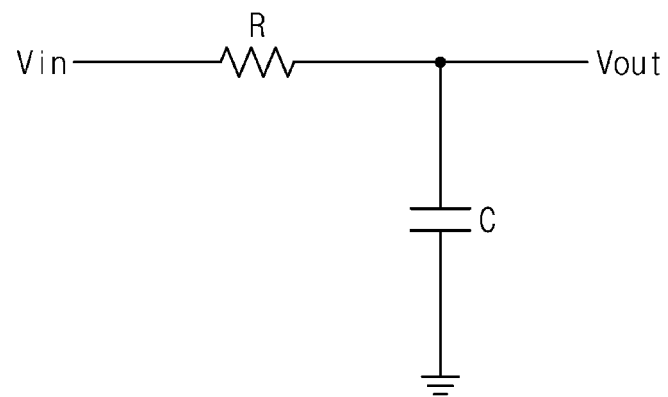
FIGS. 6A to 6C are exemplary circuit diagrams of low pass filters disclosed in FIG. 5.
Figure 6B:
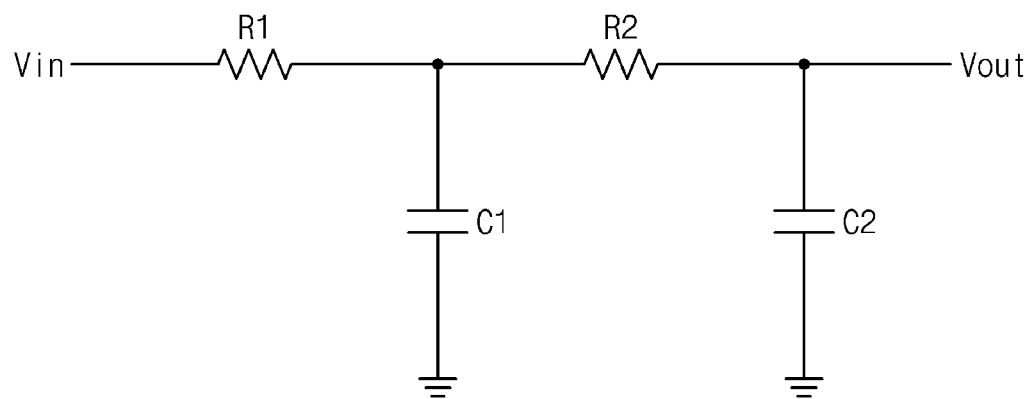
Figure 6C:
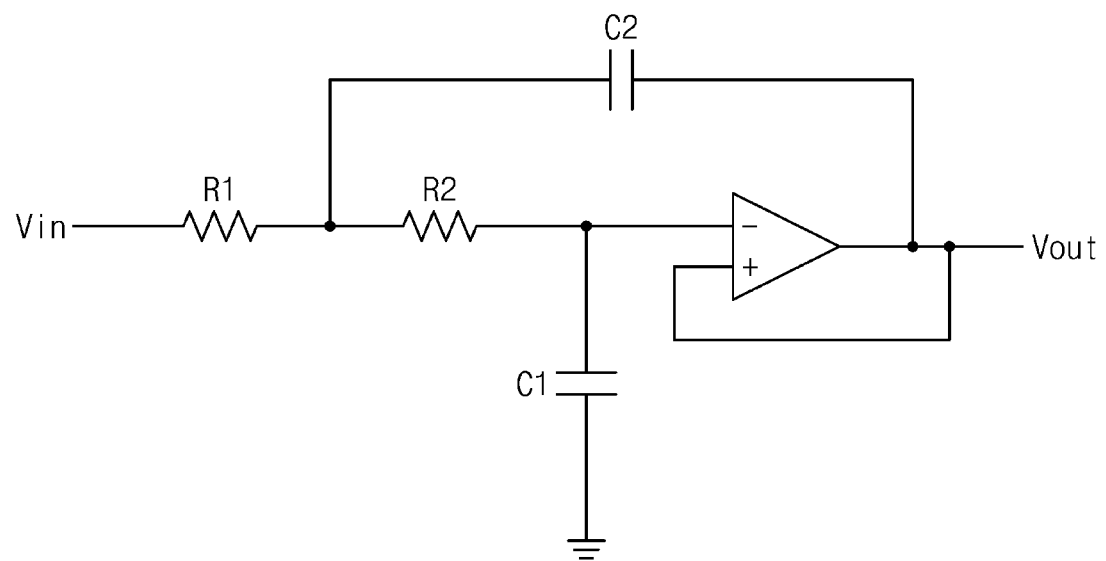

FIGS. 6A to 6C are exemplary circuit diagrams of the low pass filters LPF_1 and LPF_2 (refer to FIG. 5) disclosed in FIG. 5. The exemplary circuit diagrams disclosed in FIGS. 6A to 6C are not intended to limit the inventive concept. In the inventive concept, the low pass filters LPF_1 and LPF_2 may include low pass filters of various structures according to a signal to be processed. An order and a structure of the low pass filters LPF_1 and LPF_2 may be designed based on a frequency and a magnitude of the first and second data strobe signals DQS1 and DQS2.

FIGS. 6A and 6B illustrate exemplary circuit diagrams of a passive low pass filter. The passive low pass filter may include passive elements such as a resistor, a capacitor, and an inductor. The exemplary circuit diagram disclosed in FIG. 6A shows an example of a first-order passive low pass filter. The first-order passive low pass filter may include at least one resistor "R" and at least one capacitor "C". A first end of the resistor "R" may be referred to as an "input terminal", and a second end thereof may be referred to as an "output terminal". An input voltage may be applied to the input terminal, and an output voltage may be output from the output terminal. Also, the capacitor "C" may be disposed on a conducting wire diverging from the output terminal, and a first end of the capacitor "C" may be grounded.

The exemplary circuit diagram disclosed in FIG. 6B shows an example of a second-order passive low pass filter. The second-order passive low pass filter may include at least one two resistor R1 and R2 and at least two capacitors C1 and C2. The at least two resistors R1 and R2 may be disposed in series. A first end of the first resistor R1 may be referred to as an "input terminal", and a second end of the second resistor R2 may be referred to as an "output terminal". An input voltage may be applied to the input terminal, and an output voltage may be output from the output terminal. The first capacitor C1 may be disposed on a conducting wire diverging from a connection between the first resistor R1 and the second resistor R2, and a first end of the first capacitor C1 may be grounded. The second capacitor C2 may be disposed on a conducting wire diverging from the output terminal, and a first end of the second capacitor C2 may be grounded.

The exemplary circuit diagram disclosed in FIG. 6C shows an example of an active low pass filter. The active low pass filter may include at least one two resistor R1 and R2, at least two capacitors C1 and C2, and at least one amplifier. The at least two resistors R1 and R2 may be disposed in series. A first end of the first resistor R1 may be referred to as an "input terminal", and a first end of the second resistor R2 may be connected with a (−) terminal of the amplifier. A conducting wire of outputting a signal amplified by the amplifier may be referred to as an "output terminal". The first capacitor C1 may be disposed on a conducting wire diverging from a connection between the second resistor R2 and the (−) terminal of the amplifier, and a first end of the first capacitor C1 may be grounded. The second capacitor C2 may be disposed on a conducting wire diverging from a connection between the first resistor R1 and the second resistor R2, and a second end of the second capacitor C2 may be connected with the output terminal. Also, a conducting wire may be interposed between a (+) terminal of the amplifier and the output terminal to form a feedback loop.

Although not illustrated in FIGS. 6A to 6C, an embodiment according to the inventive concept may further include an amplifier or a buffer in front of the first and second low pass filters LPF_1 and LPF_2, unless the amplifier or the buffer influences impedances of the first ODT circuit ODT_2 (refer to FIG. 4) and the second ODT circuit ODT_3 (refer to FIG. 4) disclosed in FIG. 4.

Figure 7:
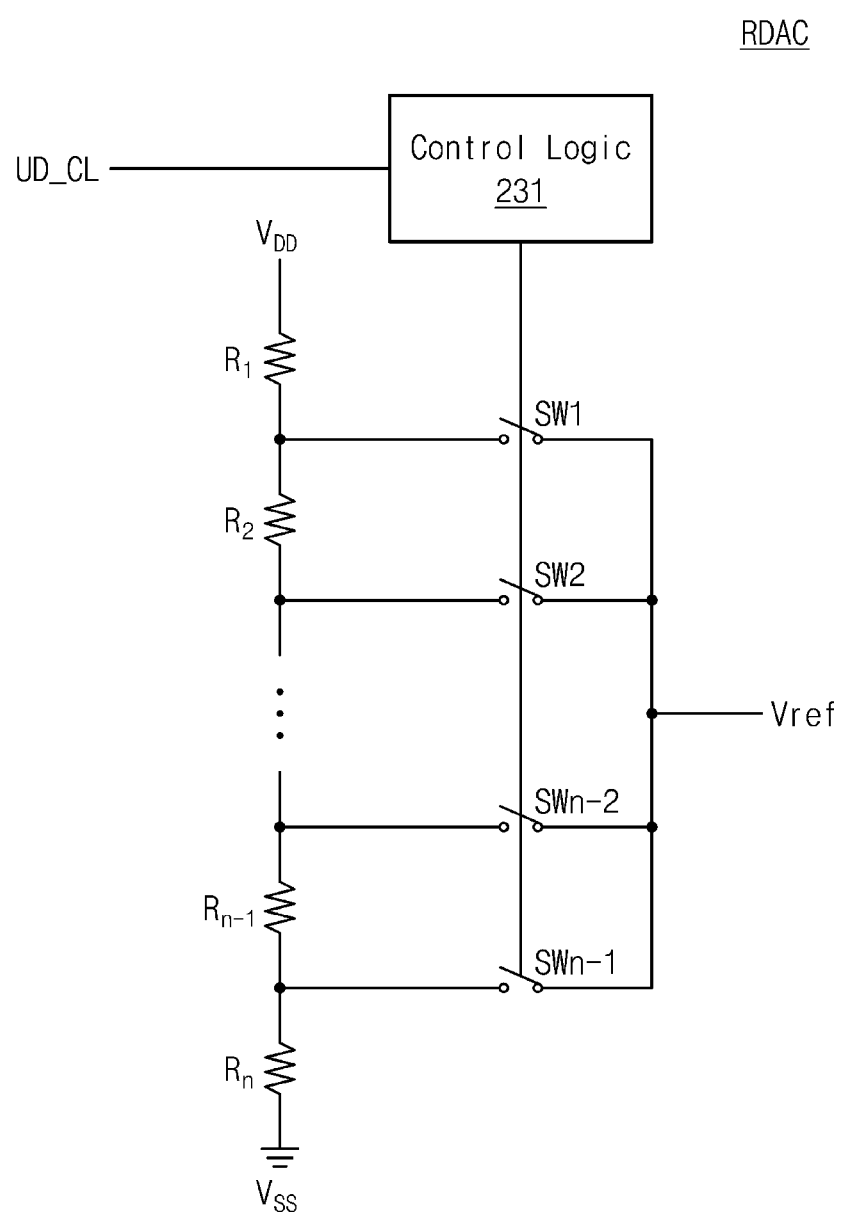
FIG. 7 is an exemplary circuit diagram of an RDAC circuit disclosed in FIG. 5.

FIG. 7 is an exemplary circuit diagram of an RDAC circuit RDAC (refer to FIG. 5) disclosed in FIG. 5. The RDAC circuit RDAC may include first to n-th resistors $R_1$ to $R_n$ (n being a natural number of 2 or more), first to (n−1)-th switches SW1 to SWn−1, and control logic 231. The first to n-th resistors R1 to Rn included in the RDAC circuit RDAC may be serially connected and may be disposed in the form of an array. Conducting wires diverging from connections between the first to n-th resistors $R_1$ to $R_n$ may be connected with first ends of the first to (n−1)-th switches SW1 to SWn−1 (n being a natural number of 2 or more). Second ends of the first to (n−1)-th switches SW1 to SWn−1 may be connected with a conducting wire of outputting the reference voltage Vref. A power supply voltage VDD may be applied to a first end of the first resistor $R_1$. A ground voltage $V_{SS}$ may be applied to a first end of the n-th resistor $R_n$.

The control logic 231 may be connected with the first to (n−1)-th switches SW1 to SWn−1. The control logic 231 may receive the up/down control signal UD_CL transmitted from the up/down counter UDC (refer to FIG. 5). The control logic 231 may determine whether to turn on or off the first to (n−1)-th switches SW1 to SWn−1, based on the up/down control signal UD_CL. In detail, based on the up/down control signal UD_CL, the control logic 231 may turn on one of the first to (n−1)-th switches SW1 to SWn−1 and may turn off the remaining switches. For example, the control logic 231 may turn off the first switch SW1 and may turn on the second to (n−1)-th switches SW2 to SWn−1.

For example, in the case where it is determined by the up/down counter UDC that the reference voltage Vref generated when the (n−1)-th switch SWn−1 is turned on is higher in level than an ideal reference voltage Vref, the control logic 231 of the RDAC circuit RDAC may turn off the (n−1)-th switch SWn−1 and may turn on the (n−2)-th switch SWn−2. Alternatively, in the case where it is determined by the up/down counter UDC that the reference voltage Vref generated when the (n−2)-th switch SWn−2 is turned on is lower in level than the ideal reference voltage Vref, the control logic 231 of the RDAC circuit RDAC may turn off the (n−2)-th switch SWn−2 and may turn on the (n−1)-th switch SWn−1. Below, an example in which a reference voltage is calibrated based on an input signal will be more fully described with reference to FIGS. 8A to 9C.

Figure 8A:
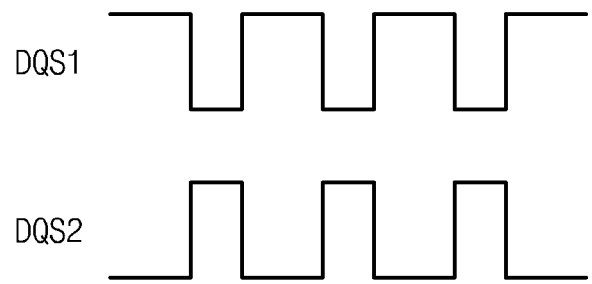
FIGS. 8A to 8C illustrate data strobe signals used in an embodiment of the inventive concept.
Figure 8B:
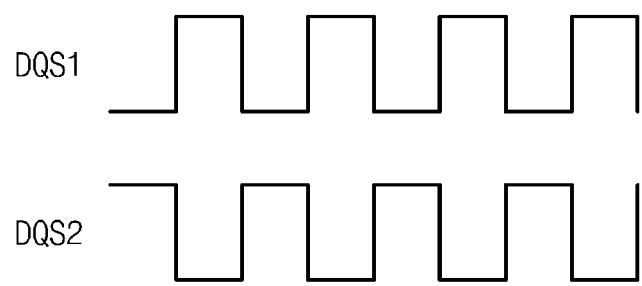
Figure 8C:
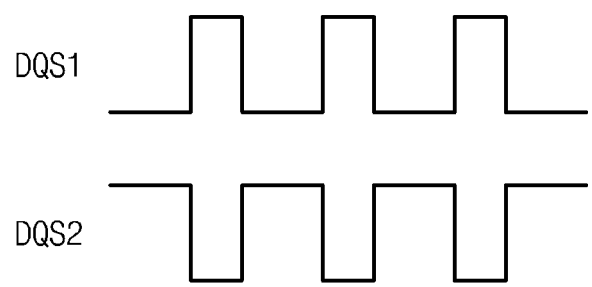

FIGS. 8A to 8C illustrate data strobe signals used in an embodiment of the inventive concept. Data strobe signals illustrated in FIGS. 8A to 8C are classified on the basis of a duty ratio. In detail, the data strobe signals DQS1 and DQS2 disclosed in FIG. 8A have a signal shape corresponding to the case where a high interval of the first data strobe signal DQS1 is wider than a low level thereof, that is, a duty ratio exceeds 50%. The data strobe signals DQS1 and DQS2 disclosed in FIG. 8B have a signal shape corresponding to the case where the high interval of the first data strobe signal DQS1 is identical to the low level thereof, that is, the duty ratio is 50%. The data strobe signals DQS1 and DQS2 disclosed in FIG. 8C have a signal shape corresponding to the case where the high interval of the first data strobe signal DQS1 is narrower to the low level thereof, that is, the duty ratio is less than 50%. Results that are drawn by using signals illustrated in FIGS. 8A to 8C to calibrate a reference voltage at the memory device 10 according to the inventive concept will be more fully described with reference to FIGS. 9A to 9C.

Figure 9A:
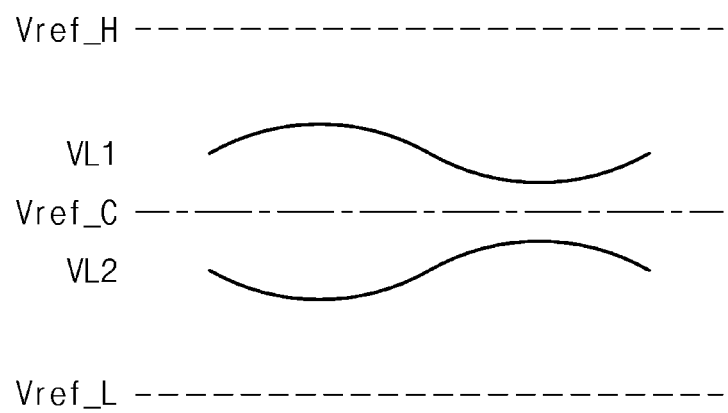
FIGS. 9A to 9C illustrate output signals corresponding to the case where data strobe signals disclosed in FIGS. 8A to 8C pass low pass filters disclosed in FIG. 5.
Figure 9B:
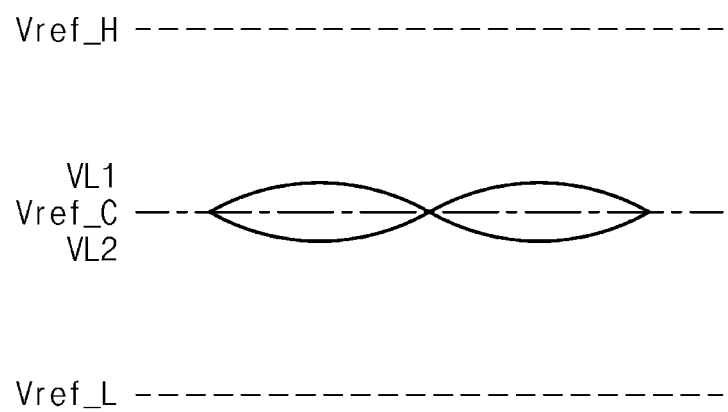
Figure 9C:
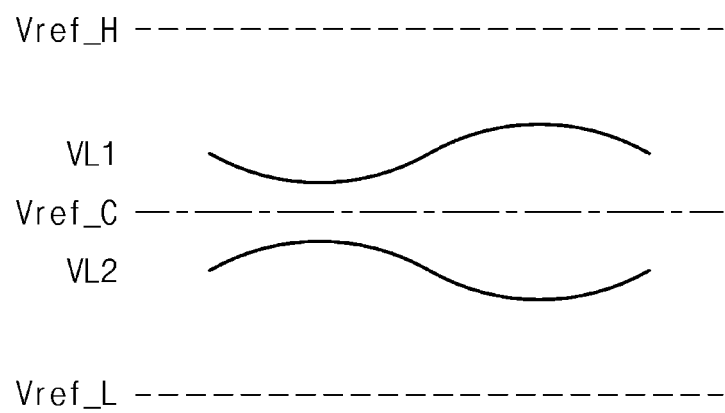

FIGS. 9A to 9C illustrate output signals corresponding to the case where the data strobe signals DQS1 and DQS2 (refer to FIGS. 8A to 8C) disclosed in FIGS. 8A to 8C pass the low pass filters LPF_1 and LPF_2 (refer to FIG. 5) disclosed in FIG. 5. In detail, FIG. 9A illustrates a signal shape corresponding to the case where the data strobe signals DQS1 and DQS2 disclosed in FIG. 8A pass the low pass filters LPF_1 and LPF_2. The first data strobe signal DQS1 may pass through the first low pass filter LPF_1 and may be output as the second data voltage signal VL1. The second data strobe signal DQS2 may pass through the second low pass filter LPF_2 and may be output as the first data voltage signal VL2.

Referring to FIG. 9A, in the case where a duty ratio exceeds 50% like the first data strobe signal DQS1 disclosed in FIG. 8A, the first data voltage signal VL1 may be output as higher in level than the second data voltage signal VL2. In the case where the duty ratio is 50% like the first data strobe signal DQS1 disclosed in FIG. 8B, the first data voltage signal VL1 and the second data voltage signal VL2 may be output at the same voltage level. In the case where the duty ratio is less than 50% like the first data strobe signal DQS1 disclosed in FIG. 8C, the first data voltage signal VL1 may be output as lower in level than the second data voltage signal VL2.

As the first data voltage signal VL1 is input to the (+) terminal of the first comparator C1 (refer to FIG. 5) and the reference voltage Vref (refer to FIG. 5) is applied to the (−) terminal of the first comparator C1, magnitudes of the first data voltage signal VL1 and the reference voltage Vref may be compared. In this case, when the magnitude of the first data voltage signal VL1 is greater than the magnitude of the reference voltage Vref, the first output code HO being an output value of the first comparator C1 may be determined as "1". When the magnitude of the first data voltage signal VL1 is smaller than the magnitude of the reference voltage Vref, the first output code HO being the output value of the first comparator C1 may be determined as "0". Also, as the second data voltage signal VL2 is input to the (+) terminal of the second comparator C2 (refer to FIG. 5) and the reference voltage Vref (refer to FIG. 5) is applied to the (−) terminal of the second comparator C2, magnitudes of the second data voltage signal VL2 and the reference voltage Vref may be compared. In this case, when the magnitude of the second data voltage signal VL2 is greater than the magnitude of the reference voltage Vref, the second output code LO being an output value of the second comparator C2 may be determined as "1". When the magnitude of the second data voltage signal VL2 is smaller than the magnitude of the reference voltage Vref, the second output code LO being the output value of the second comparator C2 may be determined as "0".

The memory device 10 according to the inventive concept may perform reference voltage calibration such that a reference voltage has a magnitude of a first reference voltage Vref_C, by using the first and second output codes HO and LO based on the output voltages VL1 and VL2 illustrated in FIGS. 9A to 9C. Meanwhile, in the case where it is determined that the reference voltage has a magnitude of a second reference voltage Vref_H, the up/down counter UDC (refer to FIG. 5) may allow the control logic 231 (refer to FIG. 7) to perform calibration of decreasing a magnitude of a reference voltage such that the reference voltage has the magnitude of the first reference voltage Vref_C. Alternatively, in the case where it is determined that the reference voltage has a magnitude of a third reference voltage Vref_L, the up/down counter UDC may allow the control logic 231 to perform calibration of increasing a magnitude of a reference voltage such that the reference voltage has the magnitude of the first reference voltage Vref_C.

The first and second output codes HO and LO disclosed in Table 1 to Table 5 below are codes output from the first and second comparators C1 and C2 and are examples for describing a reference voltage calibrating method of the memory device 10 according to the inventive concept. Below, reference voltage calibrating schemes according to an embodiment of the inventive concept when codes disclosed in Table 1 to Table 5 below are generated below will be more fully described. Codes are disclosed in Table 1 to Table 5 below as the first and second output codes HO and LO are drawn at five time points, but the number of times that codes are drawn in the memory device 10 according to the inventive concept is not limited thereto.

TABLE 1

| Time | T1 | T2 | T3 | T4 | T5 |
|------|----|----|----|----|----|
| HO   | 0  | 0  | 0  | 0  | 0  |
| LO   | 0  | 0  | 0  | 0  | 0  |

In the case of Table 1 above, the first and second output codes HO and LO are drawn as a value of "0" at all the time points T1 to T5. In this case, it may be determined that the reference voltage Vref input to the first and second comparators C1 and C2 is a voltage higher than the output voltages VL1 and VL2, that is, corresponds to the second reference voltage Vref_H. Accordingly, the up/down counter UDC may allow the control logic 231 to perform calibration of decreasing a magnitude of a reference voltage such that the reference voltage Vref has the magnitude of the first reference voltage Vref_C.

For example, in the case of Table 1 above, assuming that a present reference voltage Vref is generated in a state where the first switch SW1 (refer to FIG. 7) included in the RDAC circuit RDAC (refer to FIG. 5) is turned on, the up/down counter UDC may allow the control logic 231 to turn off the first switch SW1 and to turn on the second switch SW2 (refer to FIG. 7). Also, whether there is generated the reference voltage Vref appropriate for determining a data value by using the reference voltage Vref generated with the second switch SW2 turned on may again be determined; when it is determined that the appropriate reference voltage Vref is generated, a data read or write operation may be performed based on the reference voltage Vref thus generated. Alternatively, when it is determined that an inappropriate reference voltage Vref is generated, the above way to calibrate the reference voltage Vref may be repeatedly performed, and thus an appropriate reference voltage Vref may be drawn. In an embodiment of the inventive concept, with regard to drawing an appropriate reference voltage Vref, additional description will be omitted to avoid redundancy.

TABLE 2

| Time | T1 | T2 | T3 | T4 | T5 |
|------|----|----|----|----|----|
| HO   | 1  | 1  | 1  | 1  | 1  |
| LO   | 1  | 1  | 1  | 1  | 1  |

In the case of Table 2 above, the first and second output codes HO and LO are drawn as a value of "1" at all the time points T1 to T5. In this case, it may be determined that the reference voltage Vref input to the first and second comparators C1 and C2 is a voltage lower than the output voltages VL1 and VL2, that is, corresponds to the third reference voltage Vref_L. Accordingly, the up/down counter UDC may allow the control logic 231 to perform calibration of increasing a magnitude of a reference voltage such that the reference voltage Vref has the magnitude of the first reference voltage Vref_C. For example, in the case of Table 2 above, assuming that a present reference voltage Vref is generated in a state where the (n−1)-th switch SWn−1 included in the RDAC circuit RDAC is turned on, the up/down counter UDC may allow the control logic 231 to turn off the (n−1)-th switch SWn−1 and to turn on the (n−2)-th switch SWn−2.

TABLE 3

| Time | T1 | T2 | T3 | T4 | T5 |
|------|----|----|----|----|----|
| HO   | 1  | 1  | 1  | 1  | 1  |
| LO   | 0  | 0  | 0  | 0  | 0  |

In the case of Table 3 above, the first output code HO is drawn as a value of "1" at all the time points T1 to T5, and the second output code LO is drawn as a value of "0" at all the time points T1 to T5. Because this case corresponds to the case where levels (e.g., FIG. 9A) of the first data strobe signal DQS1 and the second data strobe signal DQS2 being differential signals are accurately distinguished, the reference voltage Vref input to the first and second comparators C1 and C2 may be determined as having the magnitude of the first reference voltage Vref_C.

TABLE 4

| Time | T1 | T2 | T3 | T4 | T5 |
|------|----|----|----|----|----|
| HO   | 1  | 0  | 1  | 0  | 1  |
| LO   | 0  | 1  | 0  | 1  | 0  |

In the case of Table 4 above, the first and second output codes HO and LO are not drawn as one value at the time points T1 to T5, but the first and second output codes HO and LO are drawn as having different results at the time points T1 to T5. Because this case corresponds to the case where levels (e.g., FIG. 9B) of the first data strobe signal DQS1 and the second data strobe signal DQS2 being differential signals are accurately distinguished, the reference voltage Vref input to the first and second comparators C1 and C2 may be determined as having the magnitude of the first reference voltage Vref_C.

TABLE 5

| Time | T1 | T2 | T3 | T4 | T5 |
|------|----|----|----|----|----|
| HO   | 0  | 0  | 0  | 0  | 0  |
| LO   | 1  | 1  | 1  | 1  | 1  |

In the case of Table 5 above, the first and second output codes HO and LO are not drawn as one value at the time points T1 to T5, but the first and second output codes HO and LO are drawn as having different results at the time points T1 to T5. Because this case corresponds to the case where levels (e.g., FIG. 9C) of the first data strobe signal DQS1 and the second data strobe signal DQS2 being differential signals are accurately distinguished, the reference voltage Vref input to the first and second comparators C1 and C2 may be determined as having the magnitude of the first reference voltage Vref_C.

The first and second output codes HO and LO disclosed in Table 1 to Table 5 above may be identically applied to the case where the first and second data strobe signals DQS1 and DQS2 have a positive (or plus or +) or negative (or minus or −) offset voltage.

Figure 10:
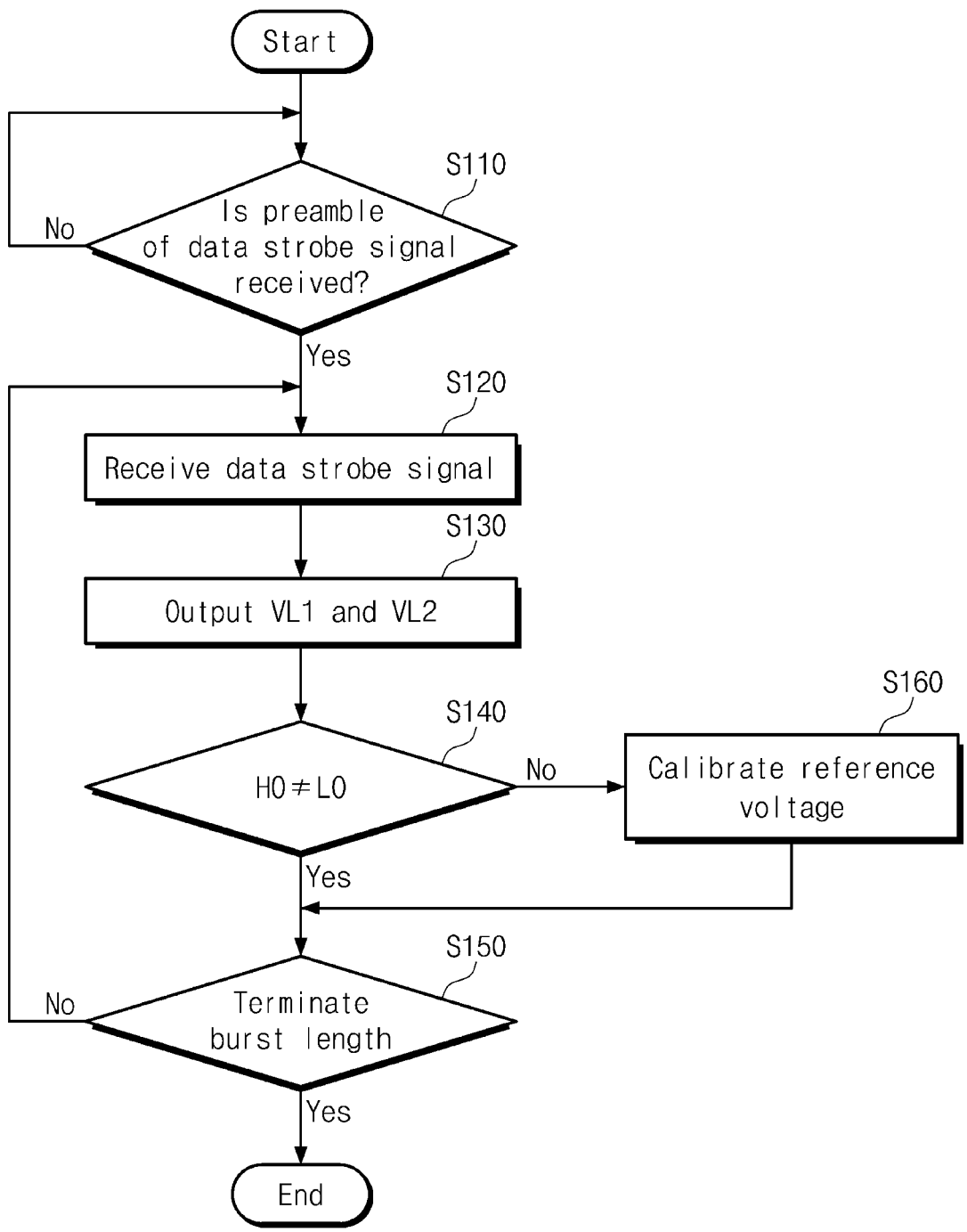
FIG. 10 is a flowchart for describing a reference voltage calibrating method according to an embodiment of the inventive concept.

FIG. 10 is a flowchart for describing a reference voltage calibrating method according to an embodiment of the inventive concept. In operation S110, the memory device 10 (refer to FIG. 1) according to an embodiment of the inventive concept may determine whether a preamble of the data strobe signal DQS (refer to FIG. 1) is received. The preamble means that an interval where the data strobe signal DQS is maintained at a low level (or a high level) during one clock before data are output. In the memory device 10 that operates in a burst mode, before the data signal DQ (refer to FIG. 1) transitions at a start point of a burst operation, the data strobe signal DQS may have the preamble where the data strobe signal DQS is out of an idle state in a pre-specified scheme.

The memory device 10 according to the inventive concept proceeds to operation S120 of receiving the preamble of the data strobe signal DQS. Alternatively, in the case where the memory device 10 according to the inventive concept does not receive the preamble of the data strobe signal DQS, the memory device 10 may return to a ready state for receiving the preamble of the data strobe signal DQS. In the specification, the expression is given as reference voltage calibration is performed based on the preamble, but the inventive concept is not limited thereto. For example, any other references (or elements) for identifying an interval where data read and write operations are performed may be used.

In operation S120, the memory device 10 according to the inventive concept may receive the data strobe signal DQS. The received data strobe signal DQS may include the first data strobe signal DQS1 (refer to FIG. 5) and the second data strobe signal DQS2 (refer to FIG. 5), and the first data strobe signal DQS1 and the second data strobe signal DQS2 may be differential signals having opposite levels. To remove an unnecessary frequency component, the first and second data strobe signals DQS1 and DQS2 may be respectively input to the second and first low pass filters LPF_2 and LPF_1 (refer to FIG. 5)

In operation S130, the first and second data strobe signals DQS1 and DQS2 respectively input to the second and first low pass filters LPF_2 and LPF_1 may be output as second and first data voltage signals VL2 and VL1 (refer to FIG. 5). In detail, the first data strobe signal DQS1 may be input to the second low pass filter LPF_2 and may be output as the second data voltage signal VL2. The second data strobe signal DQS2 may be input to the first low pass filter LPF_1 and may be output as the first data voltage signal VL1. The first and second data voltage signals VL1 and VL2 output from the first and second low pass filters LPF_1 and LPF_2 may be respectively input to the (+) terminals of the first and second comparators C1 and C2 (refer to FIG. 5). The reference voltage Vref (refer to FIG. 5) determined in advance may be applied to the (−) terminals of the first and second comparators C1 and C2.

In operation S140, the up/down counter UDC (refer to FIG. 5) may determine whether the first output code HO and the second output code LO coincide with each other. The first output code HO means a code indicating a result of comparing the first data voltage signal VL1 and the reference voltage Vref, which is drawn by the first comparator C1. The second output code LO means a code indicating a result of comparing the second data voltage signal VL2 and the reference voltage Vref, which is drawn by the second comparator C2.

When it is determined by the up/down counter UDC that the first output code HO and the second output code LO are different, it may be determined that the reference voltage Vref for determining a data value is appropriately set in the memory device 10 according to the inventive concept. In this case, a present value of the reference voltage Vref may be determined as the reference voltage Vref for determining data, and the procedure proceeds to operation S150. Meanwhile, when it is determined that the first output code HO and the second output code LO coincide with each other, a present value of the reference voltage Vref may be determined as inappropriate for determining a data value, and the procedure proceeds to operation S160.

In operation S150, the memory device 10 may determine whether a burst length is terminated. Because the operation in which the memory device 10 according to the inventive concept calibrates the reference voltage Vref is performed in the case where the data strobe signal DQS is activated, there is a need to determine whether the data strobe signal DQS switches to an idle state during the previous reference voltage (Vref) calibration time. Accordingly, whether the burst length is terminated may be determined. When it is determined that the burst length is terminated, the procedure for voltage calibration may be terminated. In this case, the memory device 10 according to the inventive concept may select the determined reference voltage Vref as a reference voltage and may use the selected reference voltage for the purpose of determining a data value of the data signal DQ. Alternatively, when it is determined that the burst length is not terminated, the data strobe signal DQS may still be in a state of being activated in the memory device 10. In this case, the procedure may return to operation S120 for receiving the data strobe signal DQS for the purpose of determining whether the variation in the reference voltage Vref occurs due to a change of an external environment. Meanwhile, although not illustrated, when it is determined that the burst length is terminated, the data strobe signal DQS may be in a state of being deactivated. In this case, the procedure may return to operation S110 for receiving the preamble of the data strobe signal DQS for the purpose of detecting an interval where the data strobe signal DQS is activated.

When the present value of the reference voltage Vref is determined as inappropriate for determining data, in operation S160, the memory device 10 may calibrate the present reference voltage Vref. The present reference voltage Vref may be set to a new reference voltage Vref by controlling the control logic 231 (refer to FIG. 7) by using the up/down control signal UD_CL (refer to FIG. 5) generated from the up/down counter UDC. When the new reference voltage Vref is set, the memory device 10 may proceed to operation S150 for the purpose of determining whether the burst length is terminated, and the remaining procedure may be performed based on a result of operation S150 in which it is determined whether the burst length is terminated.

Operation S110 to operation S160 described above may be repeatedly performed to draw an optimum reference voltage Vref. Because the reference voltage Vref set as appropriate for determining data varies depending on a temperature and an external environment, the memory device 10 according to the inventive concept may calibrate the reference voltage Vref if necessary or in real time.

According to the inventive concept, by using a device and a method for calibrating a reference voltage, a reference voltage may be calibrated without the occurrence of a black-out time while data are being transmitted, thus making it possible to make a bit error rate (BER) high.

According to the inventive concept, by using a device and a method for calibrating a reference voltage, a reference voltage may be determined based on a data strobe signal, and thus, an optimum reference voltage may be drawn regardless of distortion of a data value and a data signal.

The contents described above are specific embodiments for implementing the inventive concept. The inventive concept will include not only the embodiments described above but also embodiments in which a design is simply or easily capable of being changed. In addition, the inventive concept may also include technologies easily changed to be implemented using embodiments. Therefore, the scope of the inventive concept is not limited to the described embodiments but should be defined by the claims and their equivalents.

What is claimed is:

1. A reference voltage calibrating device comprising:
a data signal communication unit configured to transmit/receive a data signal;
a data strobe signal receiving unit configured to receive a first data strobe signal and a second data strobe signal, a voltage level of the second data strobe signal being opposite to a voltage level of the first data strobe signal; and
a reference voltage generating unit configured to set a reference voltage for determining a data value of the data signal, based on the first data strobe signal and the second data strobe signal,
wherein the reference voltage generating unit adjusts the reference voltage based on the first data strobe signal and the second data strobe signal,
wherein the reference voltage generating unit includes:
a first low pass filter configured to receive and filter the first data strobe signal to output a first voltage;
a second low pass filter configured to receive and filter the second data strobe signal to output a second data voltage;
a first comparator configured to receive the first data voltage and the reference voltage and to output a first signal based on the first data voltage and the reference voltage;
a second comparator configured to receive the second data voltage and the reference voltage and to output a second signal based on the second data voltage and the reference voltage;

an up/down counter configured to perform a control operation for calibrating the reference voltage based the first signal and the second signal; and a resistive digital-to-analog converter (RDAC) circuit configured to calibrate and output the reference voltage based on the control operation of the up/down counter.

2. The reference voltage calibrating device of claim 1, wherein the data signal communication unit includes:

a data signal receiving unit configured to receive the data signal; and a data signal transmitting unit configured to transmit the data signal.

3. The reference voltage calibrating device of claim 2, wherein the data signal receiving unit includes:

a first on-die termination circuit configured to adjust a resistance of a data signal pin in receiving the data signal;

continuous time linear equalization configured to receive the data signal and the reference voltage and to compensate for a partial frequency component of the data signal;

an amplifier configured to receive and amplify the data signal in which the partial frequency component is removed; and a comparator configured to determine a data value of the data signal.

4. The reference voltage calibrating device of claim 2, wherein the data signal transmitting unit includes a driver circuit configured to transfer the data signal.

5. The reference voltage calibrating device of claim 1, wherein the data strobe signal receiving unit includes:

a first on-die termination circuit configured to adjust a resistance of a first data strobe signal pin receiving the first data strobe signal;

a second on-die termination circuit configured to adjust a resistance of a second data strobe signal pin receiving the second data strobe signal;

continuous time linear equalization configured to receive the first data strobe signal and the second data strobe signal and to compensate for a partial frequency component; and an amplifier configured to amplify a signal output from the continuous time linear equalization.

6. The reference voltage calibrating device of claim 1, wherein the RDAC circuit includes:

first to n-th resistors serially connected and disposed in the form of an array; and first to (n−1)-th switches disposed on conducting wires diverging from connections between the first to n-th resistors.

7. The reference voltage calibrating device of claim 6, wherein whether to turn on or off the first to (n−1)-th switches is determined by the control operation performed by the up/down counter.

8. The reference voltage calibrating device of claim 7, wherein one of the first to (n−1)-th switches is turned on, and remaining switches thereof are turned off.

9. A reference voltage calibrating method comprising:

receiving a first data strobe signal and a second data strobe signal being a differential signal of the first data strobe signal;

filtering the first data strobe signal and the second data strobe signal;

outputting a first data voltage and a second data voltage based on the filtered first data strobe signal and the filtered second data strobe signal;

outputting a first signal based on the first data voltage and a reference voltage;

outputting a second signal based on the second data voltage and the reference voltage;

calibrating the reference voltage based on the first signal and the second signal;

receiving a data signal; and determining the data signal based on the reference voltage.

10. The reference voltage calibrating method of claim 9, wherein the outputting of the first signal and the second signal is performed in response to receiving a preamble of the first data strobe signal and the second data strobe signal.

11. The reference voltage calibrating method of claim 9, further comprising:

comparing the first signal and the reference voltage to output a first output code; and comparing the second signal and the reference voltage to output a second output code.

12. The reference voltage calibrating method of claim 11, wherein, when the first output code and the second output code are identical at least once, an up/down counter controls control logic to calibrate the reference voltage, and wherein, when the first output code and the second output code are different, the up/down counter maintains the reference voltage.

13. The reference voltage calibrating method of claim 9, wherein the outputting of the first signal and the second signal is terminated in response to that a burst length is terminated.

* * * * *